United States Patent
Kaneda

(10) Patent No.: US 10,122,298 B2
(45) Date of Patent: Nov. 6, 2018

(54) SEMICONDUCTOR DEVICE AND POWER CONVERSION DEVICE

(71) Applicant: FUJI ELECTRIC CO., LTD., Kanagawa (JP)

(72) Inventor: Hirotoshi Kaneda, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 15/658,460

(22) Filed: Jul. 25, 2017

(65) Prior Publication Data

US 2018/0062541 A1 Mar. 1, 2018

(30) Foreign Application Priority Data

Sep. 1, 2016 (JP) ................. 2016-171286

(51) Int. Cl.
| | | |
|---|---|---|
| *H02M 7/5395* | (2006.01) | |
| *H02M 1/08* | (2006.01) | |
| *H03K 17/16* | (2006.01) | |
| *H02P 27/08* | (2006.01) | |

(52) U.S. Cl.
CPC .......... *H02M 7/5395* (2013.01); *H02M 1/08* (2013.01); *H03K 17/161* (2013.01); *H02P 27/08* (2013.01)

(58) Field of Classification Search
CPC ...... H02M 7/003; H02M 7/217; H02M 7/537; H02M 7/538; H02M 7/5387; H02M 7/5395; H02M 1/08; H02P 27/08; H03K 17/161
USPC ................. 363/123, 127, 131, 132, 134–137
See application file for complete search history.

(56) References Cited

U.S. PATENT DOCUMENTS

| | | | | |
|---|---|---|---|---|
| 3,637,915 A | * | 1/1972 | Hirano ................... | G10H 1/057 84/702 |
| 6,320,362 B1 | * | 11/2001 | Baek ..................... | H02M 1/088 323/281 |
| 8,008,988 B1 | * | 8/2011 | Yang .................... | H03K 17/693 333/101 |

FOREIGN PATENT DOCUMENTS

| | | |
|---|---|---|
| JP | 5453848 B2 | 3/2014 |
| JP | 5572962 B2 | 8/2014 |
| JP | 5577607 B2 | 8/2014 |
| JP | 5852745 B2 | 2/2016 |

* cited by examiner

Primary Examiner — Yemane Mehari
(74) Attorney, Agent, or Firm — Ostrolenk Faber LLP

(57) ABSTRACT

A semiconductor device includes a unipolar switching element having a drain terminal, a gate terminal, and a source terminal, wherein a serial connection body of a capacitor and a resistor is connected between the drain terminal and the gate terminal.

7 Claims, 10 Drawing Sheets

CIRCUIT DIAGRAM

EXAMPLE OF ELECTRODE PATTERN ARRANGEMENT

SEMICONDUCTOR DEVICE AND POWER CONVERSION DEVICE

BACKGROUND OF THE INVENTION

Field of the Invention

The present invention relates to a semiconductor device and a power conversion device.

Priority is claimed on Japanese Patent Application No. 2016-171286, filed Sep. 1, 2016, the content of which is incorporated herein by reference.

Description of Related Art

A power conversion device such as an inverter is generally used as one of power energy conversion means. A power conversion device is composed of a combination of semiconductor devices for power conversion such as a switching element such as an insulated gate bipolar transistor (IGBT) or a metal oxide silicon field effect transistor (MOSFET), and a flyback diode (freewheel diode) connected in reverse parallel to the switching element, or a flyback diode that independently operates according to the intended use or the magnitude of power. Because stable operation with high efficiency is required for a power conversion device, stable operation with low loss and in which it is difficult for malfunction to occur is required for a semiconductor device, including both a switching element and a flyback diode, which are elements of the power conversion device.

In a power conversion device, an LCR series circuit is mainly formed by a resistance component, an inductance component, and a capacitor component which are parasitic in a wiring, a switching element, a flyback diode and the like. When a DC voltage is applied to an LCR series circuit, it is known that a voltage and a current oscillate and reach constant values when exponentially decaying. Therefore, during switching of a semiconductor device in a power conversion device, current oscillation and voltage oscillation are inevitably generated.

Due to advances in semiconductor manufacturing technology in recent years, for a semiconductor device constituted mainly of silicon (Si), a semiconductor device can be constituted with a switching element or a flyback diode using silicon carbide (SiC) due to an advantage of the material characteristics thereof. In a semiconductor device using SiC, because high-speed switching operation is performed, it is known that dv/dt and di/dt at the time of switching become steep, which can promote current oscillation and voltage oscillation.

In order to solve this, for example, Japanese Patent Publication No. 5572962 and Japanese Patent Publication No. 5453848 disclose a semiconductor device in which a CR snubber circuit is constituted by connecting serial connection bodies of a capacitor and a resistor in parallel between a high voltage side terminal (drain terminal) and a low voltage side terminal (source terminal) of a switching element which performs a unipolar operation. Particularly, Japanese Patent Publication No. 5572962 proposes that a ratio of electrostatic capacitance of a capacitor to a sum of electrostatic capacitance in a disconnected state between a flyback diode and a switching element be 0.1 or greater.

In the related art, because the capacitor constituting the CR snubber circuit charges and discharges every time a switching operation of the switching element is performed, the loss E shown in Equation (1) is generated. According to the above related art, the loss E needs to be consumed by the resistance of the CR snubber circuit. However, because the loss E increases in proportion to a capacitance C of the capacitor and a frequency f, sizes of the resistance and a heat dissipation mechanism are increased inevitably.

$$E = CV^2 f \tag{1}$$

Furthermore, because dv/dt and di/dt themselves at the time of switching remain steep, an effect of reducing a surge voltage itself is small.

SUMMARY OF THE INVENTION

The present invention provides a semiconductor device and a power conversion device capable of suppressing current and voltage oscillations at the time of switching operation and suppressing increase in size of a circuit.

An aspect of the present invention is a semiconductor device including a switching element having a high voltage side terminal, a control terminal, and a low voltage side terminal, wherein a serial connection body of a capacitor and a resistor is connected between the high voltage side terminal and the control terminal.

According to an aspect of the present invention, in the above-described semiconductor device, a capacitance of the capacitor in the serial connection body is equal to or greater than a feedback capacitance that is parasitic between the high voltage side terminal and the control terminal of the switching element and is set to be ten times or less the feedback capacitance.

According to an aspect of the present invention, the above-described semiconductor device includes a package including the switching element therein and a substrate configured to support the switching element in the package, wherein the capacitor and the resistor in the serial connection body are arranged on the substrate.

According to an aspect of the present invention, the above-described semiconductor device includes an external connection control terminal that allows the control terminal of the switching element to be drawn outside of the package and be connected to an external circuit, wherein, in the package, a resistor is connected between the control terminal of the switching element and the external connection control terminal.

According to an aspect of the present invention, the above-described semiconductor device includes a bipolar switching element configured to perform a bipolar operation as the switching element and a unipolar switching element configured to perform a unipolar operation as the switching element, wherein the serial connection body is connected between the high voltage side terminal and the control terminal of the bipolar switching element and between the high voltage side terminal and the control terminal of the unipolar switching element.

An aspect of the present invention is a power conversion device that includes the above-described semiconductor device.

An aspect of the present invention is a semiconductor device that includes a switching element having a high voltage side terminal, a control terminal, and a low voltage side terminal, a package including the switching element therein, and two or more of each of an external connection high voltage side terminal that allows the high voltage side terminal to be drawn to the outside of the package and be connected to an external circuit and an external connection control terminal that allows the control terminal to be drawn to the outside of the package and be connected to an external circuit.

An aspect of the present invention is a power conversion device including the above-described semiconductor device, wherein a serial connection body of a capacitor and a resistor is connected between the external connection high voltage side terminal and the external connection control terminal.

According to an aspect of the present invention, in the above-described power conversion device, the capacitor and the resistor in the serial connection body are set as a time constant that suppresses resonance characteristics that occur due to an inductance component and a capacitance component present in a circuit to which the semiconductor device is connected and an output capacitance parasitic between the high voltage side terminal and the low voltage side terminal of the switching element.

According to the above-described semiconductor device and power conversion device, current and voltage oscillations can be suppressed, and increase in size of a circuit can be suppressed.

DETAILED DESCRIPTION OF THE INVENTION

First Embodiment

Hereinafter, a power conversion device and a semiconductor device according to a first embodiment will be described with reference to FIGS. 1 to 7.

(Circuit Constitution of Power Conversion Device)

Figure 1:
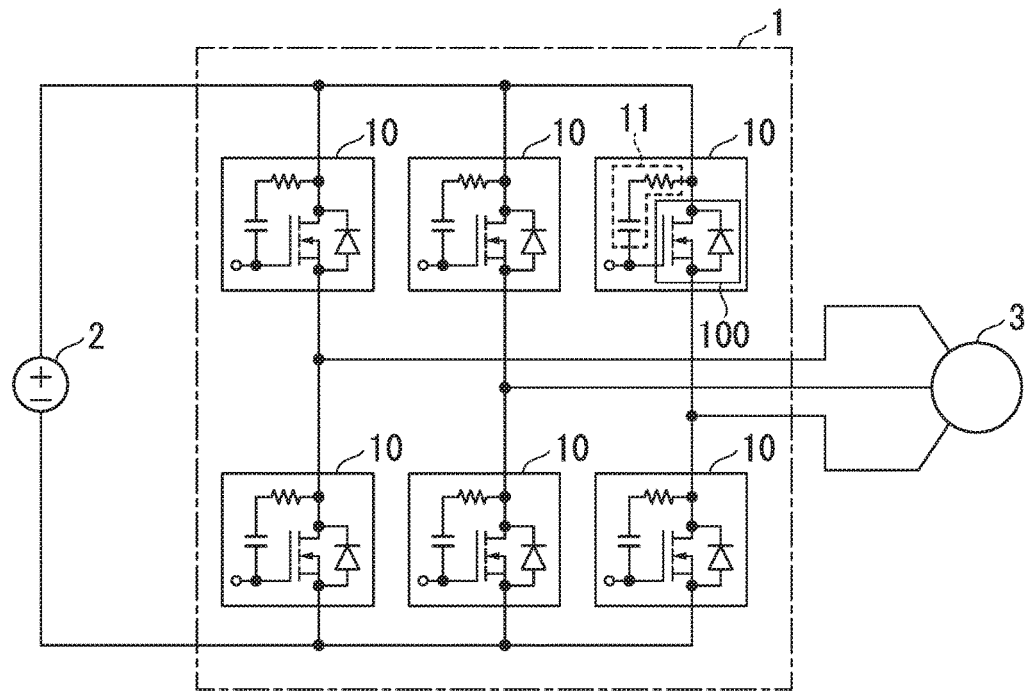
FIG. 1 is a view illustrating a circuit constitution of a power conversion device according to a first embodiment.

FIG. 1 is a view illustrating a circuit constitution of a power conversion device according to a first embodiment.

As illustrated in FIG. 1, a power conversion device 1 is connected between a DC power source 2 configured to transmit DC power and an induction motor 3 that is driven with three-phase AC power. The power conversion device 1 converts the DC power supplied from the DC power source 2 into the three-phase AC power for driving the induction motor 3.

The power conversion device 1 is an inverter circuit having a plurality of semiconductor devices 10. Specifically, the power conversion device 1 includes a total of six semiconductor devices 10, two semiconductor devices 10 corresponding to each phase of the three-phase AC power. The two semiconductor devices 10 corresponding to each phase of the three-phase AC power are "upper arm" and "lower arm", respectively, and are serially connected between a high potential output side and a low potential output side of the DC power source 2.

The semiconductor device 10 performs a switching operation (a transition from an ON (conductive) state to an OFF (cut-off) state and a transition from the OFF state to the ON state) based on a pulse width modulation (PWM) control signal from a control circuit (not illustrated). The power conversion device 1 converts the DC power transmitted from the DC power source 2 into AC power by each of the six semiconductor devices 10 performing the switching operation based on the PWM control signal.

As illustrated in FIG. 1, the semiconductor device 10 according to the first embodiment has a unipolar switching element 100 and a serial connection body 11. Hereinafter, the constitution of the semiconductor device 10 according to the first embodiment will be described in detail with reference to FIGS. 2 and 3.

(Circuit Constitution of Semiconductor Device)

Figure 2:
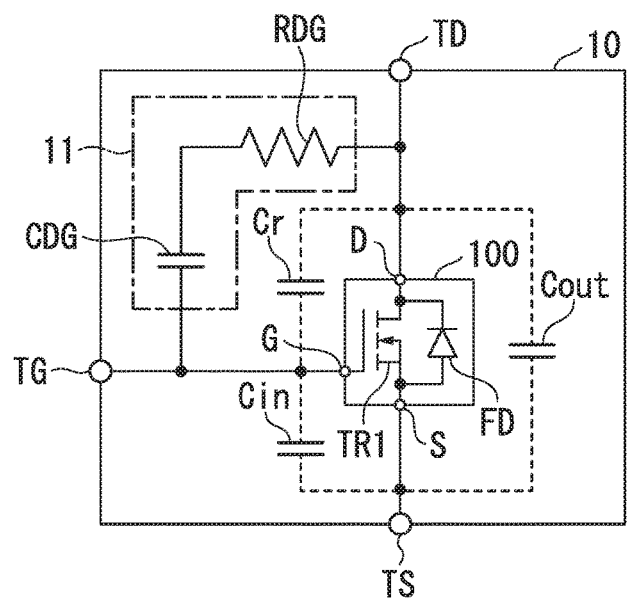
FIG. 2 is a view illustrating a circuit constitution of a semiconductor device according to the first embodiment.

FIG. 2 is a view illustrating a circuit constitution of a semiconductor device according to the first embodiment.

Figure 3:
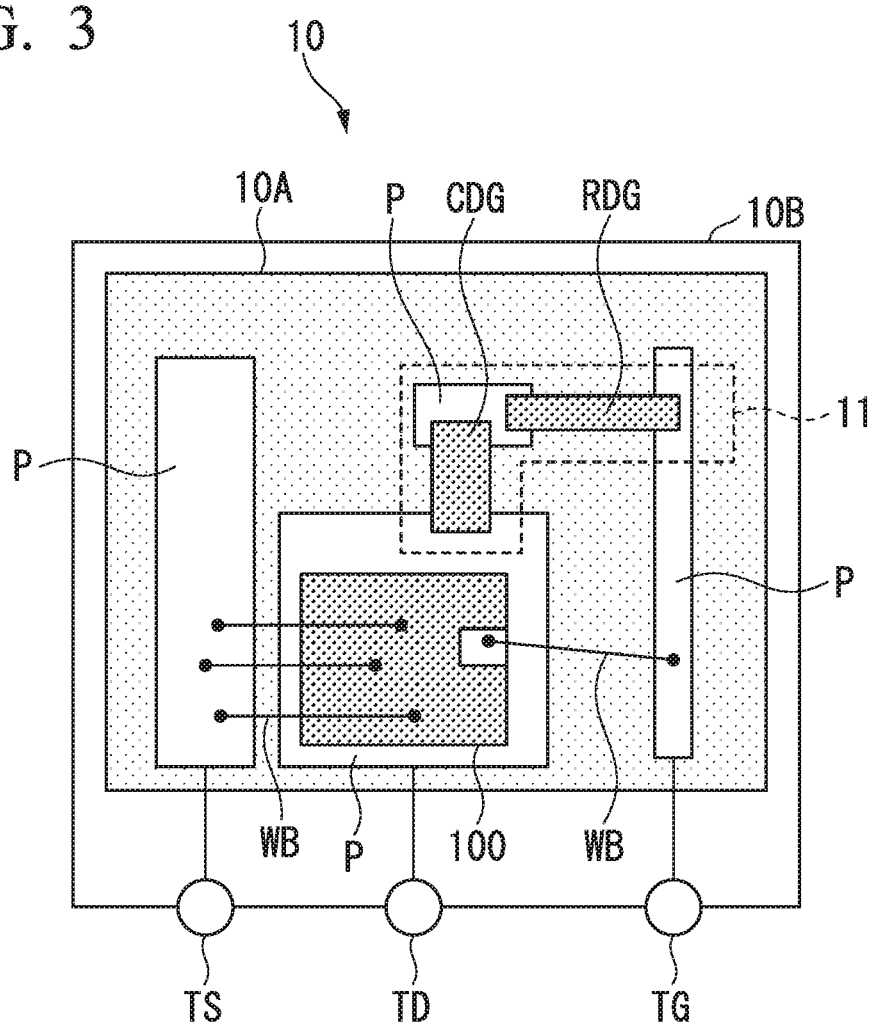
FIG. 3 is a view schematically illustrating a structure of the semiconductor device according to the first embodiment.

Also, FIG. 3 is a view schematically illustrating a structure of the semiconductor device according to the first embodiment.

As illustrated in FIGS. 2 and 3, the semiconductor device 10 includes the unipolar switching element 100 and the serial connection body 11.

The unipolar switching element 100 is a so-called semiconductor chip, and a metal oxide silicon field effect transistor (MOS-FET) (hereinafter, simply referred to as "transistor TR1") which is a transistor configured to perform a unipolar operation and a flyback diode FD are integrally formed in the unipolar switching element 100 (see FIG. 2). In the unipolar switching element 100, the flyback diode FD is connected in a forward direction from a source to a drain between the drain and the source of the transistor TR1.

Also, the unipolar switching element 100 has three terminals, a drain terminal D (high voltage side terminal), a gate terminal G (control terminal), and a source terminal S (low voltage side terminal). The drain terminal D is a terminal connected to the drain of the transistor TR1. The gate terminal G is a terminal connected to a gate of the transistor TR1. Further, the source terminal S is a terminal connected to the source of the transistor TR1.

A parasitic capacitance generated due to the structure of the MOS-FET (transistor TR1) is present between each of the terminals of the unipolar switching element 100. Specifically, as illustrated in FIG. 2, an input capacitance Cin is present between the source terminal S and the gate terminal G of the unipolar switching element 100. An output capacitance Cout is present between the source terminal S and the drain terminal D of the unipolar switching element 100. Further, a feedback capacitance Cr is present between the drain terminal D and the gate terminal G of the unipolar switching element 100. Here, because the transistor TR1 according to the present embodiment is a general power type MOS-FET, the feedback capacitance Cr [pF] is smaller by about 1 or 2 orders of magnitude as compared with the output capacitance Cout [pF] and the input capacitance Cin [pF].

The serial connection body 11 includes a capacitor CDG and a resistor RDG connected in series between the drain terminal D and the gate terminal G of the unipolar switching element 100. In the present embodiment, each of the capacitor CDG and the resistor RDG is constituted by a capacitor element which is independent (separate from the unipolar switching element 100) and a resistor element. Further, in the present embodiment, the capacitor CDG has no special nonlinear characteristics and is a capacitor element having normal linear characteristics (characteristics in which a capacitance value does not change according to an applied voltage).

As illustrated in FIG. 3, the semiconductor device 10 includes a substrate 10A and a package 10B. The package 10B protects the unipolar switching element 100 by packaging the unipolar switching element 100 and the like therein. The substrate 10A is a substrate having a conductive electrode pattern P on an insulating substrate and supports the unipolar switching element 100 which is a semiconductor chip in the package 10B. Further, the capacitor CDG and the resistor RDG constituting the serial connection body 11 are also arranged on the substrate 10A.

As illustrated in FIGS. 2 and 3, the semiconductor device 10 includes an external connection control terminal TG, an external connection high voltage side terminal TD, and an external connection low voltage side terminal TS.

The external connection control terminal TG is a terminal that draws the gate terminal G of the unipolar switching element 100 to an outside of the package 10B and allows the gate terminal G to be connected to an external circuit (the inverter circuit of the power conversion device 1). Specifically, the external connection control terminal TG extends from the inside to the outside of the package 10B and is electrically connected to the gate terminal G of the unipolar switching element 100 via a bonding wire WB and the conductive electrode pattern P inside the package 10B.

The external connection high voltage side terminal TD is a terminal that draws the drain terminal D of the unipolar switching element 100 to the outside of the package 10B and allows the drain terminal D to be connected to an external circuit.

The external connection low voltage side terminal TS is a terminal that draws the source terminal S of the unipolar switching element 100 to the outside of the package 10B and allows the source terminal S to be connected to an external circuit.

The external connection high voltage side terminal TD and the external connection low voltage side terminal TS also have the same constitution as the above-described external connection control terminal TG.

(Description of Action and Effect)

Figure 4:
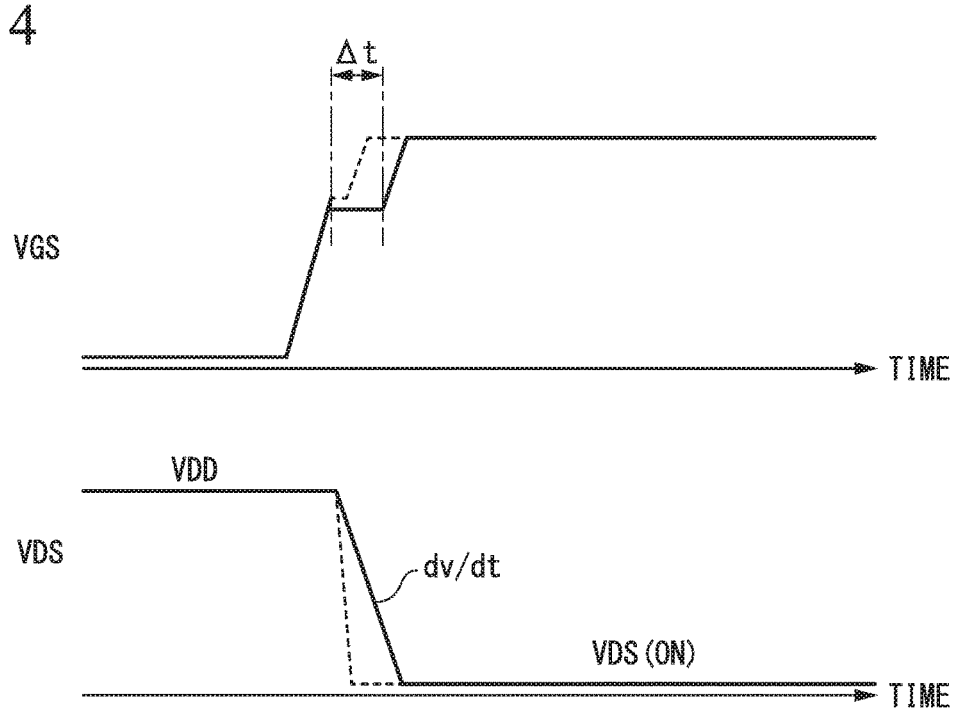
FIG. 4 is a first view for describing a function of a serial connection body according to the first embodiment.
Figure 5:
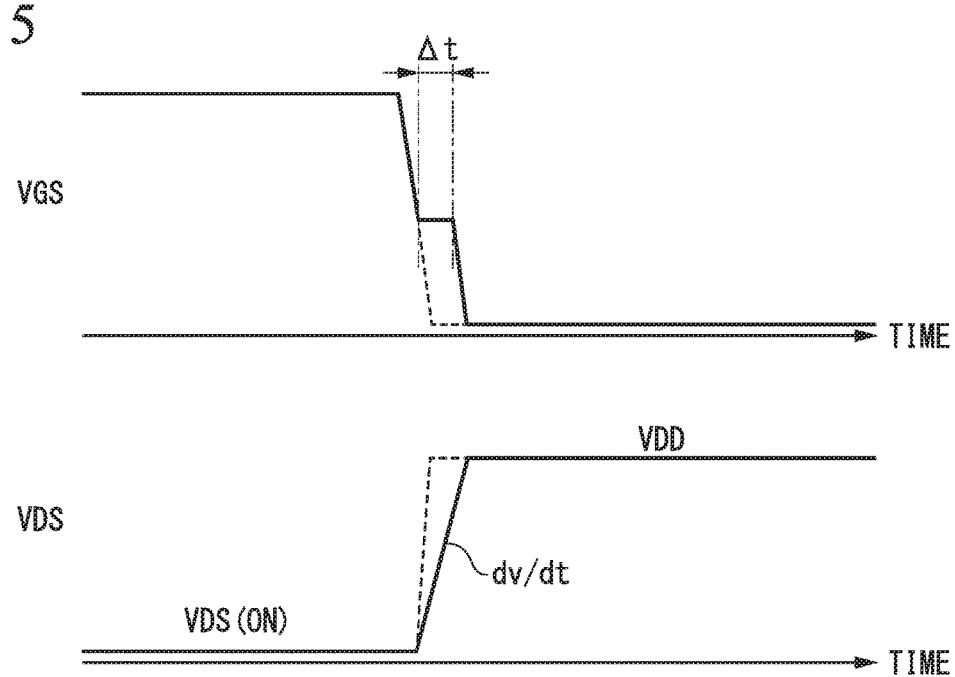
FIG. 5 is a second view for describing a function of the serial connection body according to the first embodiment.

FIGS. 4 and 5 are respectively a first view and a second view for describing a function of a serial connection body according to the first embodiment.

Both FIGS. 4 and 5 schematically illustrate changes over time of a potential VGS between the source and the gate and a potential between the source and the drain of the transistor TR1 in the semiconductor device 10. FIG. 4 illustrates a transition (turn-on) from an Off-state to an On-state in the transistor TR1, and FIG. 5 illustrates a transition (turn-off) from the On-state to the Off-state.

Solid line graphs illustrated in FIGS. 4 and 5 show a behavior in a case in which the unipolar switching element 100 includes the serial connection body 11. Also, dashed line graphs illustrated in FIGS. 4 and 5 show a behavior in a case in which the unipolar switching element 100 does not include the serial connection body 11.

At the time of turn-on, as illustrated in FIG. 4, by a charge accumulated in the output capacitance Cout (see FIG. 2) being discharged, the potential VDS between the source and the drain drops from a power source voltage VDD to a voltage VDS (ON) at the time of conduction. Here, the dropping speed dv/dt is related to the capacitance of the feedback capacitance Cr as well as the capacitance of the output capacitance Cout.

More specifically, the feedback capacitance Cr is connected to the output capacitance Cout in parallel as an equivalent circuit. Due to this, as the output capacitance Cout discharges, the feedback capacitance Cr connected in parallel to the output capacitance Cout is also discharged. As a result, a period (a mirror period Δt (FIG. 4)) during which the applied voltage (i.e., the potential VGS between the source and the gate) of the feedback capacitance Cr in a charging process by a control signal from the gate terminal G is almost constant is generated. In the present embodiment, by adjusting the mirror period Δt with a discharging time constant of the serial connection body 11 connected between the gate terminal G and the drain terminal D, the dropping speed dv/dt of the potential VDS between the source and the drain is adjusted, and waveform oscillation/surge voltage is suppressed.

That is, because the mirror period Δt is extended due to the discharging time constant of the serial connection body 11, the dropping speed dv/dt of the potential VDS between the source and the drain also decreases (see solid lines in FIG. 4).

The operation at the time of turn-off can be described as a process opposite to that of the above-described operation at the time of turn-on. That is, at the time of turn-off, as illustrated in FIG. 5, by a charge being accumulated (charged) in the output capacitance Cout in an empty state, the potential VDS between the source and the drain rises from the voltage VDS (ON) to the power source voltage VDD at the time of conduction. Here, the rising speed dv/dt is related to the capacitance of the feedback capacitance Cr connected to the output capacitance Cout in parallel as well as the capacitance of the output capacitance Cout. Due to this, as the output capacitance Cout is charged, the feedback capacitance Cr connected in parallel to the output capacitance Cout is also charged. As a result, a period (a mirror period Δt (FIG. 5)) during which the potential VGS between the source and the gate in a discharging process by a control signal from the gate terminal G is almost constant is generated. In the present embodiment, by adjusting the mirror period Δt with a charging time constant of the serial connection body 11 connected between the gate terminal G and the drain terminal D, the rising speed dv/dt of the potential VDS between the source and the drain is adjusted, and waveform oscillation/surge voltage is suppressed.

That is, because the mirror period Δt is extended due to the charging time constant of the serial connection body 11, the rising speed dv/dt of the potential VDS between the source and the drain also decreases (see solid lines in FIG. 5).

Figure 6:
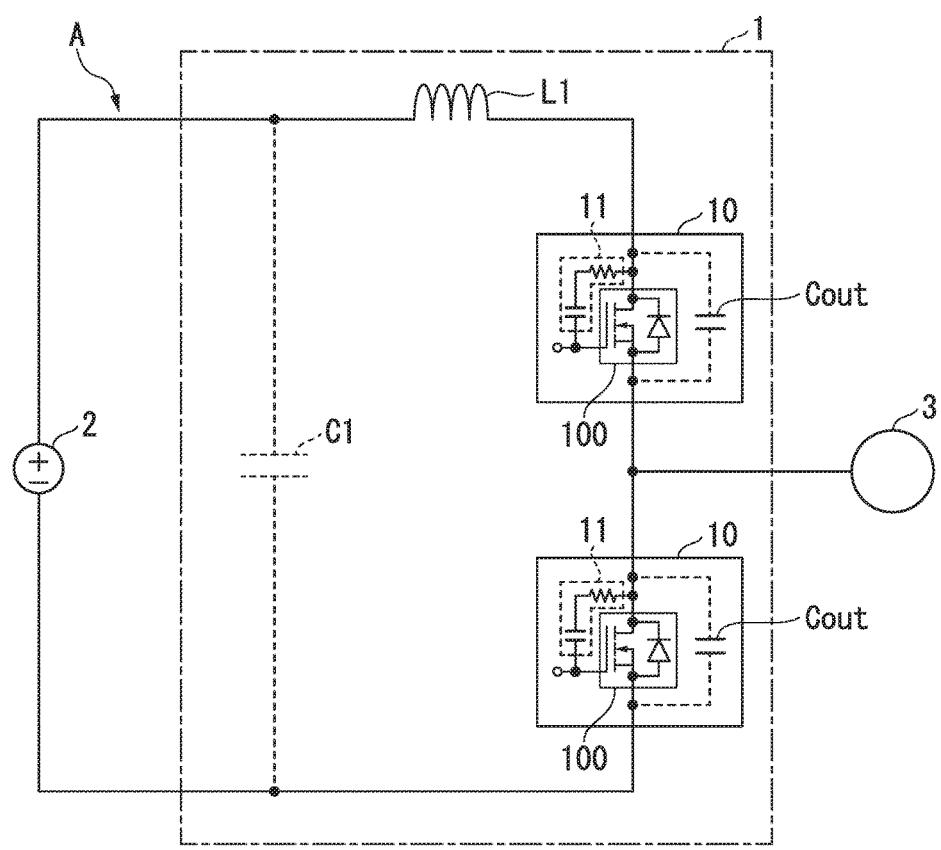
FIG. 6 is a first view for describing characteristics of the serial connection body according to the first embodiment.

FIG. 6 is a first view for describing characteristics of the serial connection body according to the first embodiment.

In the power conversion device 1 illustrated in FIG. 6, only two semiconductor devices 10 corresponding to one phase of the three phases are illustrated.

As described above, by providing the serial connection body 11, the mirror period Δt is appropriately adjusted based on the time constant, and a sharp increase in the potential VDS between the source and the drain is suppressed (see FIGS. 4 and 5). Here, how to set a time constant τ (a product of the capacitance of the capacitor CDG and the resistance value of the resistor RDG) of the serial connection body 11 will be specifically described with reference to FIG. 6.

As illustrated in FIG. 6, the power conversion device 1 has a wiring A configured to electrically connect the two semiconductor devices 10, the DC power source 2, and the induction motor 3. Also, FIG. 6 illustrates an equivalent circuit having an inductance component L1 and a capacitance component C1 parasitically present on the wiring A of the power conversion device 1.

As illustrated in FIG. 6, a serial LC resonance circuit is formed by the inductance component L1, the capacitance component C1, and the output capacitance Cout that is parasitically present in each of the two semiconductor devices 10. A resonance frequency f0 of the serial LC resonance circuit is calculated by $f0=1/(2\pi\sqrt{(L \cdot C)})$ (where L=L1, 1/C=1/C1+2·1/Cout). Therefore, during the switching operation of the semiconductor device 10, waveform oscillation of the resonance frequency f0 is generated.

To suppress the resonance characteristics of the resonance frequency f0, the time constant τ(=RDG·CDG) of the serial connection body 11 has to satisfy Equation (2) below.

$$\tau = RDG \cdot CDG < 2\pi\sqrt{(L \cdot C)} \quad (2)$$

In this way, the capacitor CDG and the resistor RDG in the serial connection body 11 are set to be a time constant τ that suppresses the resonance characteristics generated due to the inductance component L1 and the capacitance component C1 present in a circuit to which the semiconductor device 10 is connected (the wiring A of the power conversion device 1) and the output capacitance Cout parasitic between the drain terminal D and the source terminal S of the unipolar switching element 100.

In the above description, although only the inductance component L1 parasitic to the wiring A is considered as "L" in Equation (2), another inductance component may be included in "L" in another embodiment. For example, an inductance component parasitic between the drain terminal D and the source terminal S of the unipolar switching element 100 (hereinafter referred to as "L2") may be further taken into consideration (that is, L=L1+2·L2 is acceptable).

Figure 7:
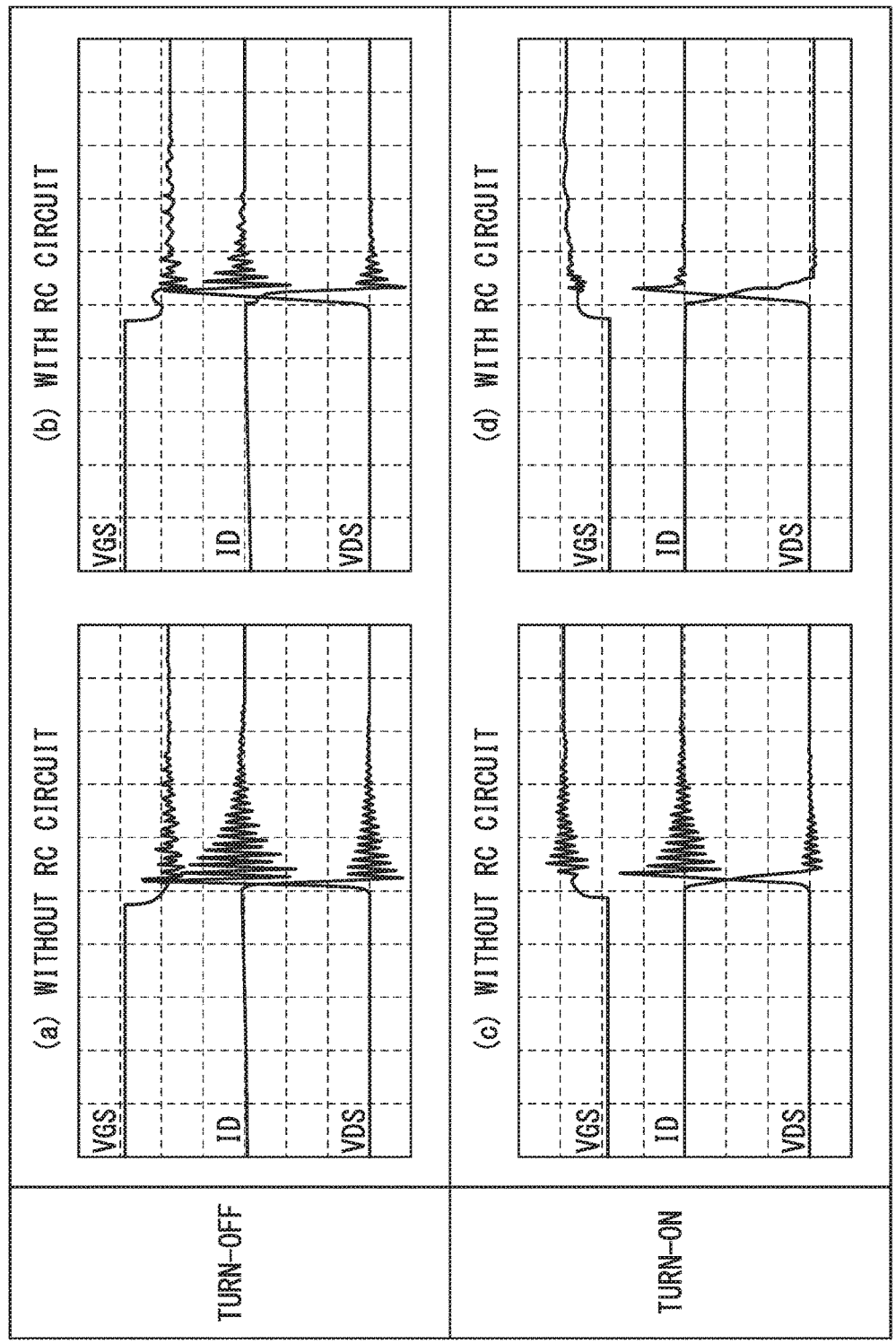
FIG. 7 is a second view for describing characteristics of the serial connection body according to the first embodiment.

FIG. 7 is a second view for describing characteristics of the serial connection body according to the first embodiment.

All of (a) to (d) of FIG. 7 are actually measured waveforms showing changes over time of the potential VGS between the source and the gate, the potential VDS between the source and the drain, and a drain current ID. In (a) to (d) of FIG. 7, the horizontal axis indicates time, and the vertical axis indicates voltage and current. (a) and (c) of FIG. 7 are actually measured waveforms of a semiconductor device which does not include an RC circuit (the serial connection body 11) between the gate terminal G and the drain terminal D, and (b) and (d) of FIG. 7 are actually measured waveforms of the semiconductor device 10 which includes the RC circuit (the serial connection body 11) between the gate terminal G and the drain terminal D. Further, (a) and (b) of FIG. 7 illustrate waveforms at the time of Off-operation (at the time of turn-off), and (c) and (d) of FIG. 7 illustrate waveforms at the time of On-operation (at the time of turn-on).

Here, the capacitance of the capacitor CDG and the resistance value of the resistor RDG constituting the serial connection body 11 in Figs. (b) and (d) of FIG. 7 are 470 pF and 15Ω, respectively. According to (a) to (d) of FIG. 7, it can be seen that, by including the serial connection body 11, waveform oscillation can be suppressed at the time of both the On-operation and the Off-operation.

Further, the feedback capacitance Cr of the switching element (the unipolar switching element 100) of the semiconductor device that has acquired the actually measured waveforms of (a) to (d) of FIG. 7 is about 300 pF. In this way, by setting the capacitance of the capacitor CDG of the serial connection body 11 to about several times (1 to 10 times) the feedback capacitance Cr or about the same order as the feedback capacitance Cr, an effect of remarkably suppressing waveform oscillation can be obtained.

Here, to describe the effect of the semiconductor device 10 according to the present embodiment, as a comparison, the related art in which a CR snubber circuit is constituted by connecting serial connection bodies of a capacitor and a resistor in parallel between the drain terminal D and the source terminal S of the unipolar switching element 100 will be described. When the CR snubber circuit is used, to obtain an effective vibration suppression effect, the capacitance of the capacitor of the CR snubber circuit has to be set to a value that conforms to the output capacitance Cout parasitic between the drain terminal D and the source terminal S. Here, it is known that the capacitance of the output capacitance Cout is about two orders of magnitude larger than that of the feedback capacitance Cr in a normal unipolar switching element. Thus, in the case of the related art, sizes of the capacitor and the resistor element (and the heat dissipation mechanism of the resistor element) constituting the CR snubber circuit need to be increased.

In contrast, according to the semiconductor device 10 according to the present embodiment, as described above, waveform oscillation can be remarkably suppressed to a capacitance that is several times larger than the feedback capacitance Cr of the serial connection body 11 (about 1.5 times in the example illustrated in FIG. 7). Therefore, current and voltage oscillations can be suppressed, and increase in size of a circuit can be suppressed.

In the CR snubber circuit provided between the drain terminal D and the source terminal S according to the related art, the rising speed/dropping speed dv/dt of the potential VDS between the source and the drain cannot be controlled. Therefore, sharp changes in the potential VDS between the source and the drain and the like at the time of turn-on or turn-off cannot be suppressed. Thus, the peak of the waveform oscillation is still high, and the effect of suppressing the surge voltage itself is low.

On the other hand, according to the semiconductor device 10 according to the present embodiment, because the mirror period Δt of the potential VGS between the source and the gate (see FIGS. 4 and 5) is adjusted, the rising speed/dropping speed dv/dt of the potential VDS between the source and the drain is also adjusted (decreased). Therefore, according to the semiconductor device 10 according to the present embodiment, the peak itself of waveform oscillation can be suppressed.

Second Embodiment

Next, a power conversion device and a semiconductor device according to a second embodiment will be described with reference to FIGS. 8 and 9.

(Circuit Constitution of Power Conversion Device)

Figure 8:
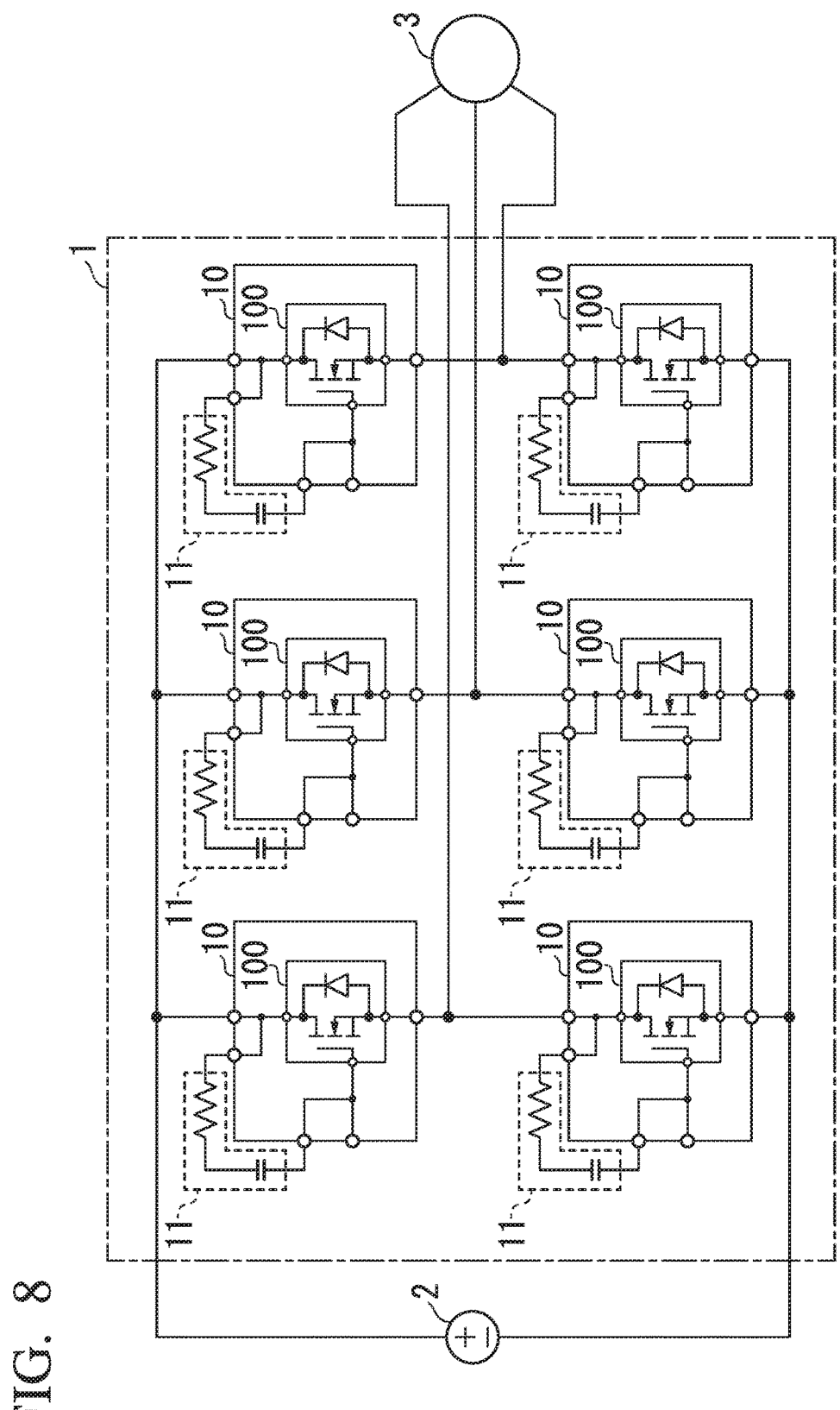
FIG. 8 is a view illustrating a circuit constitution of a power conversion device according to a second embodiment.

FIG. 8 illustrates a circuit constitution of a power conversion device according to the second embodiment.

As illustrated in FIG. 8, like the first embodiment, a power conversion device 1 according to the second embodiment has six unipolar switching elements 100 (semiconductor devices 10) and six serial connection bodies 11 provided corresponding to the unipolar switching elements 100. However, unlike the first embodiment, each of the serial connection bodies 11 is provided outside the semiconductor device 10.

(Circuit Constitution of Semiconductor Device and Serial Connection Body)

Figure 9:
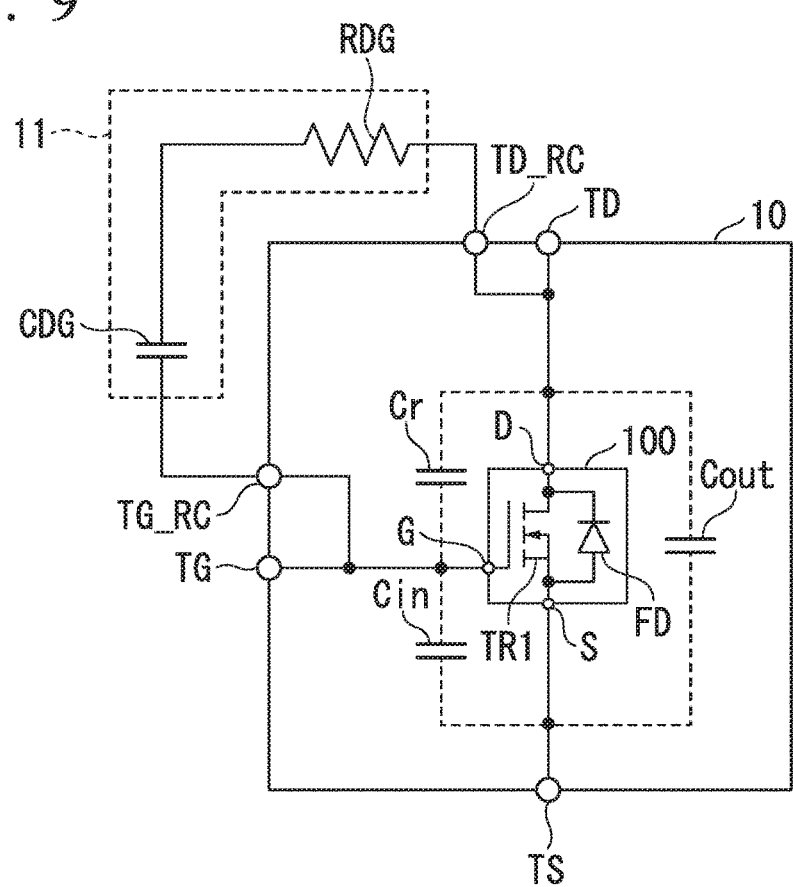
FIG. 9 is a view illustrating a circuit constitution of a semiconductor device and a serial connection body according to the second embodiment.

FIG. 9 is a view illustrating a circuit constitution of a semiconductor device and a serial connection body according to the second embodiment.

Unlike the first embodiment, the semiconductor device 10 according to the second embodiment does not include the serial connection body 11 inside the package 10B (see FIG. 3). On the other hand, the semiconductor device 10 according to the second embodiment further includes an external connection terminal for connecting with the serial connection body 11 outside.

Specifically, the semiconductor device 10 includes two external connection terminals (external connection high voltage side terminals TD and TG_RC) that draw the drain terminal D of the unipolar switching element 100 in the semiconductor device 10 to the outside of the package 10B (see FIG. 3) and allow the drain terminal D to be connected to an external circuit. Further, the semiconductor device 10 includes two external connection terminals (external connection control terminals TG and TG_RC) that draw the gate terminal G of the unipolar switching element 100 to the outside of the package 10B (see FIG. 3) and allow the gate terminal G to be connected to an external circuit.

The external connection high voltage side terminal TD, the external connection control terminal TG, and an external connection low voltage side terminal TS are normal terminals used for connecting the semiconductor device 10 to a major circuit (the inverter circuit) of the power conversion device 1. On the other hand, the external connection high voltage side terminal TD_RC and the external connection control terminal TG_RC are terminals provided to connect the semiconductor device 10 to the serial connection body 11 outside.

In this way, by constituting the serial connection body 11 to be externally attached as an external circuit of the semiconductor device 10, the capacitance of the capacitor CDG and the resistance value of the resistor RDG may be appropriately changed according to inherent characteristics of the power conversion device 1 (e.g., the inductance component L1 or the capacitance component C1 parasitic to the wiring A (see FIG. 6)).

Third Embodiment

Next, a semiconductor device according to a third embodiment will be described with reference to FIGS. 10A and 10B.

(Circuit Constitution and Structure of Semiconductor Device)

Figure 10A:
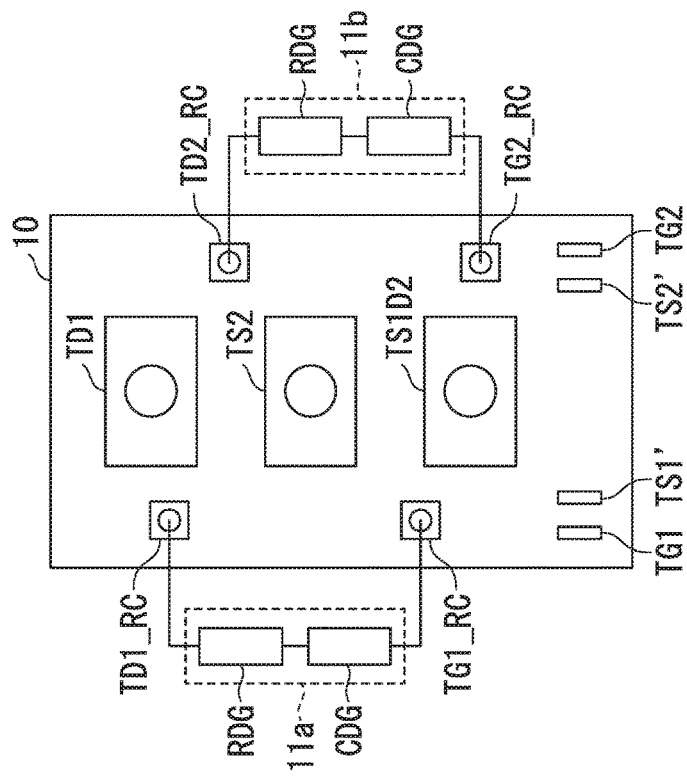
FIG. 10A is a view schematically illustrating a circuit constitution of a semiconductor device according to a third embodiment.

FIG. 10A is a view schematically illustrating a circuit constitution of a semiconductor device according to a third embodiment.

Figure 10B:
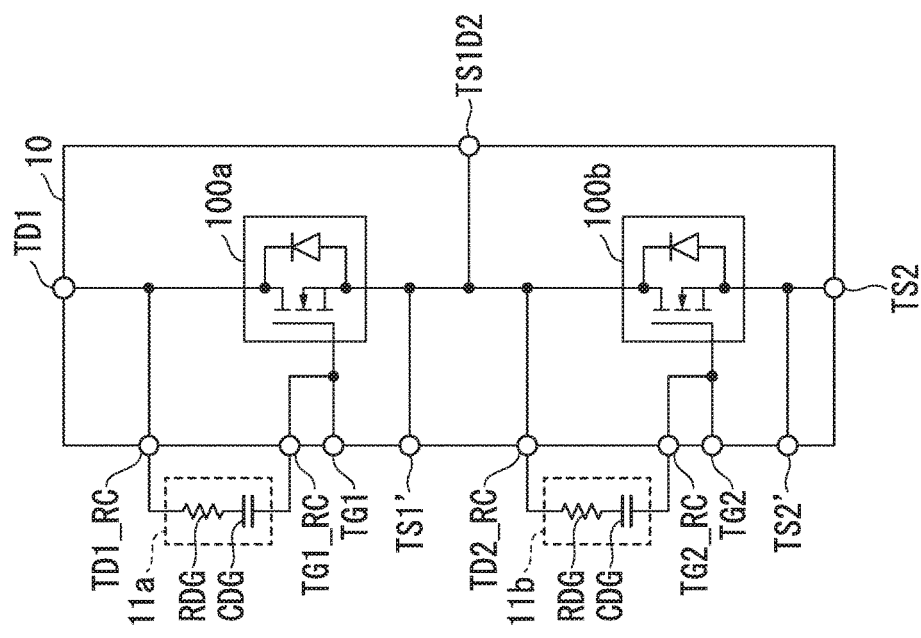
FIG. 10B is a view schematically illustrating a structure of the semiconductor device according to the third embodiment.

FIG. 10B is a view schematically illustrating a structure of the semiconductor device according to the third embodiment.

Like the second embodiment, a semiconductor device 10 according to the third embodiment has the serial connection body 11 externally attached to the outside of the semiconductor device 10. However, the semiconductor device 10 is different from that of the second embodiment in that the semiconductor device 10 includes two unipolar switching elements 100a and 100b which constitute an upper arm and a lower arm.

As illustrated in FIG. 10A, the semiconductor device 10 according to the third embodiment includes a unipolar switching element 100a that serves as an upper arm and a unipolar switching element 100b that serves as a lower arm disposed inside a package.

As illustrated in a circuit diagram of FIG. 10A and an electrode pattern arrangement example of FIG. 10B, the semiconductor device 10 according to the third embodiment includes a plurality of external connection terminals.

Specifically, the semiconductor device 10 includes an external connection high voltage side terminal TD1 for connecting a high potential output side of the DC power source 2 to the upper arm (the unipolar switching element 100a) and an external connection low voltage side terminal TS2 for connecting a low potential output side of the DC power source 2 to the lower arm (the unipolar switching element 100b). Further, the semiconductor device 10 includes an external connection terminal TS1D2 connected to an intermediate connection point between the upper arm and the lower arm to transmit AC power to the induction motor 3.

The semiconductor device 10 includes two external connection terminals (external connection high voltage side terminals TD1 and TD1_RC) that draw the drain terminal D of the unipolar switching element 100a inside the semiconductor device 10 to the outside of the package and allow the drain terminal D to be connected to an external circuit.

Further, the semiconductor device 10 includes two external connection terminals (external connection control terminals TG1 and TG1_RC) that draw the gate terminal G of the unipolar switching element 100a to the outside of the package and allow the gate terminal G to be connected to an external circuit.

Further, the semiconductor device 10 includes two external connection terminals (external connection control terminals TG2 and TG2_RC) that draw the gate terminal G of the unipolar switching element 100b inside the semiconductor device 10 to the outside of the package and allow the gate terminal G to be connected to an external circuit.

Further, the semiconductor device 10 includes a single external connection terminal (an external connection high voltage side terminal TD2_RC) that draw the drain terminal D of the unipolar switching element 100b to the outside of the package and allows the drain terminal D to be connected to an external circuit.

The external connection high voltage side terminal TD1, the external connection control terminals TG1 and TG2, and the external connection low voltage side terminal TS2 are terminals used to connect the semiconductor device 10 to a major circuit (the inverter circuit) of the power conversion device 1. On the other hand, the external connection high voltage side terminal TD1_RC and the external connection control terminal TG1_RC are terminals provided for connecting the semiconductor device 10 to a serial connection body 11a at an outside corresponding to the unipolar switching element 100a.

The external connection high voltage side terminal TD2_RC and the external connection control terminal TG2_RC are terminals provided for connecting the semiconductor device 10 to a serial connection body 11b at an outside corresponding to the unipolar switching element 100b.

Further, the semiconductor device 10 includes separate external connection terminals (external connection low voltage side terminals TS1' and TS2') for drawing out a source terminals of each of the unipolar switching elements 100a and 100b.

In this way, the semiconductor device 10 according to the third embodiment has a modular structure in which the unipolar switching element 100a that constitutes the upper arm and the unipolar switching element 100b that constitutes the lower arm are integrally packaged. The semiconductor device 10 has a constitution in which the serial connection bodies 11a and 11b corresponding to each of the two unipolar switching elements 100a and 100b can be externally attached independently.

In the second embodiment and the third embodiment, the semiconductor device 10 is described as having two external connection control terminals TG and two external connection high voltage side terminals TD, but the semiconductor device 10 is not limited thereto in another embodiment. That is, a semiconductor device 10 according to another embodiment may include three or more external connection control terminals TG and three or more external connection high voltage side terminals TD for the purpose of being connected to still another external circuit.

Fourth Embodiment

Next, a semiconductor device according to a fourth embodiment will be described with reference to FIG. 11.
(Circuit Constitution of Semiconductor Device)
FIG. 11 is a view illustrating a circuit constitution of a semiconductor device according to a fourth embodiment.

Figure 11:
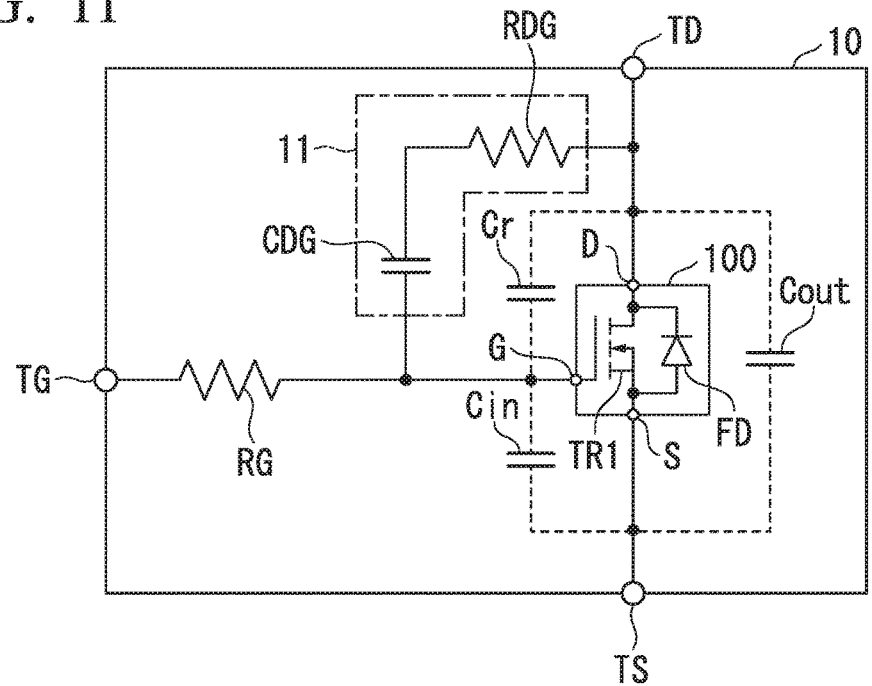
FIG. 11 is a view illustrating a circuit constitution of a semiconductor device according to a fourth embodiment.

As illustrated in FIG. 11, like the first embodiment, a semiconductor device 10 according to the fourth embodiment has the serial connection body 11 mounted therein (in a package). However, the semiconductor device 10 according to the fourth embodiment is different from that of the first embodiment in that a resistor RG is connected between the gate terminal G of the unipolar switching element 100 and the external connection control terminal TG in the package.

The resistor RG is provided to suppress variation in the characteristics of each element of the switching operation according to a control signal applied to the gate terminal G of the unipolar switching element 100.

When the resistor RG for suppressing variation in the characteristics of each element is provided in the package, one end of the serial connection body 11 is connected between the resistor RG and the gate terminal G of the unipolar switching element 100.

With such a constitution, because a speed of a charge being accumulated in the gate of the transistor TR1 becomes uniform by the resistor RG, variation in the characteristics of each element of the switching operation can be suppressed, and waveform oscillation at the time of switching operation can be suppressed.

Fifth Embodiment

Next, a semiconductor device according to a fifth embodiment will be described with reference to FIG. 12.
(Circuit Constitution of Semiconductor Device)
FIG. 12 is a view illustrating a circuit constitution of a semiconductor device according to a fifth embodiment.

Figure 12:
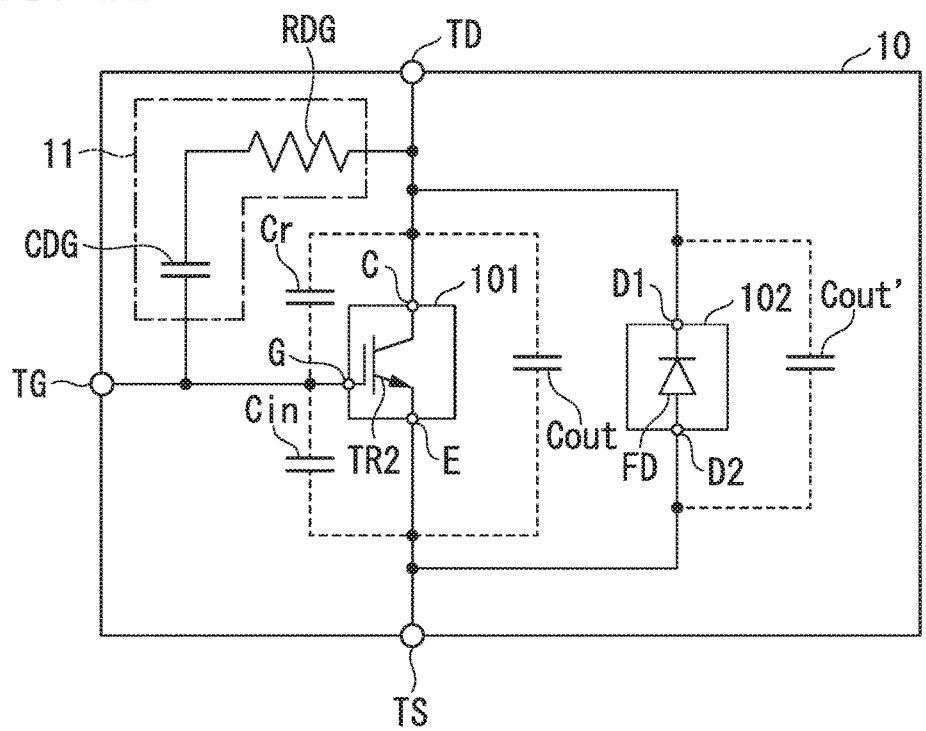
FIG. 12 is a view illustrating a circuit constitution of a semiconductor device according to a fifth embodiment.

As illustrated in FIG. 12, a semiconductor device 10 according to the fifth embodiment includes a bipolar switching element 101.

The bipolar switching element 101 is a so-called semiconductor chip and has an IGBT which is a transistor configured to perform a bipolar operation (hereinafter, simply referred to as "transistor TR2") formed therein (see FIG. 12).

The bipolar switching element 101 has three terminals, a collector terminal C (high voltage side terminal), a gate terminal G (control terminal), and an emitter terminal E (low voltage side terminal). The collector terminal C is a terminal connected to a collector of the transistor TR2. The gate terminal G is a terminal connected to a gate of the transistor TR2. Further, the emitter terminal E is a terminal connected to an emitter of the transistor TR2.

Separate from the semiconductor chip constituting the bipolar switching element 101, the semiconductor device 10 according to the fifth embodiment includes a diode element 102 which is a semiconductor chip in which a flyback diode FD is formed.

The diode element 102 includes connection terminals D1 and D2. The flyback diode FD inside the diode element 102 is formed to be in the forward direction from the connection terminal D2 to the connection terminal D1.

The connection terminal D1 of the diode element 102 is connected to the collector terminal C of the bipolar switching element 101, and the connection terminal D2 of the diode element 102 is connected to the emitter terminal E of the bipolar switching element 101.

An output capacitance Cout is present between the collector terminal C and the emitter terminal E of the bipolar switching element 101. Also, a parasitic capacitance Cout' is present between the connection terminal D1 and the connection terminal D2 of the diode element 102.

Like the first embodiment, the semiconductor device 10 according to the fifth embodiment includes the serial connection body 11 inside the package.

Like the first embodiment, the capacitance of the capacitor CDG and the resistance value of the resistor RDG constituting the serial connection body 11 are adjusted to satisfy Equation (2). However, in the fifth embodiment, the capacitance of the capacitor CDG and the resistance value of the resistor RDG may also be adjusted in consideration of the parasitic capacitance Cout' present between the connection terminals D1 and D2 of the diode element 102 as well as the output capacitance Cout of the bipolar switching element 101.

Sixth Embodiment

Next, a semiconductor device according to a sixth embodiment will be described with reference to FIG. 13.
(Circuit Constitution of Semiconductor Device)
FIG. 13 is a view illustrating a circuit constitution of a semiconductor device according to a sixth embodiment.

Figure 13:
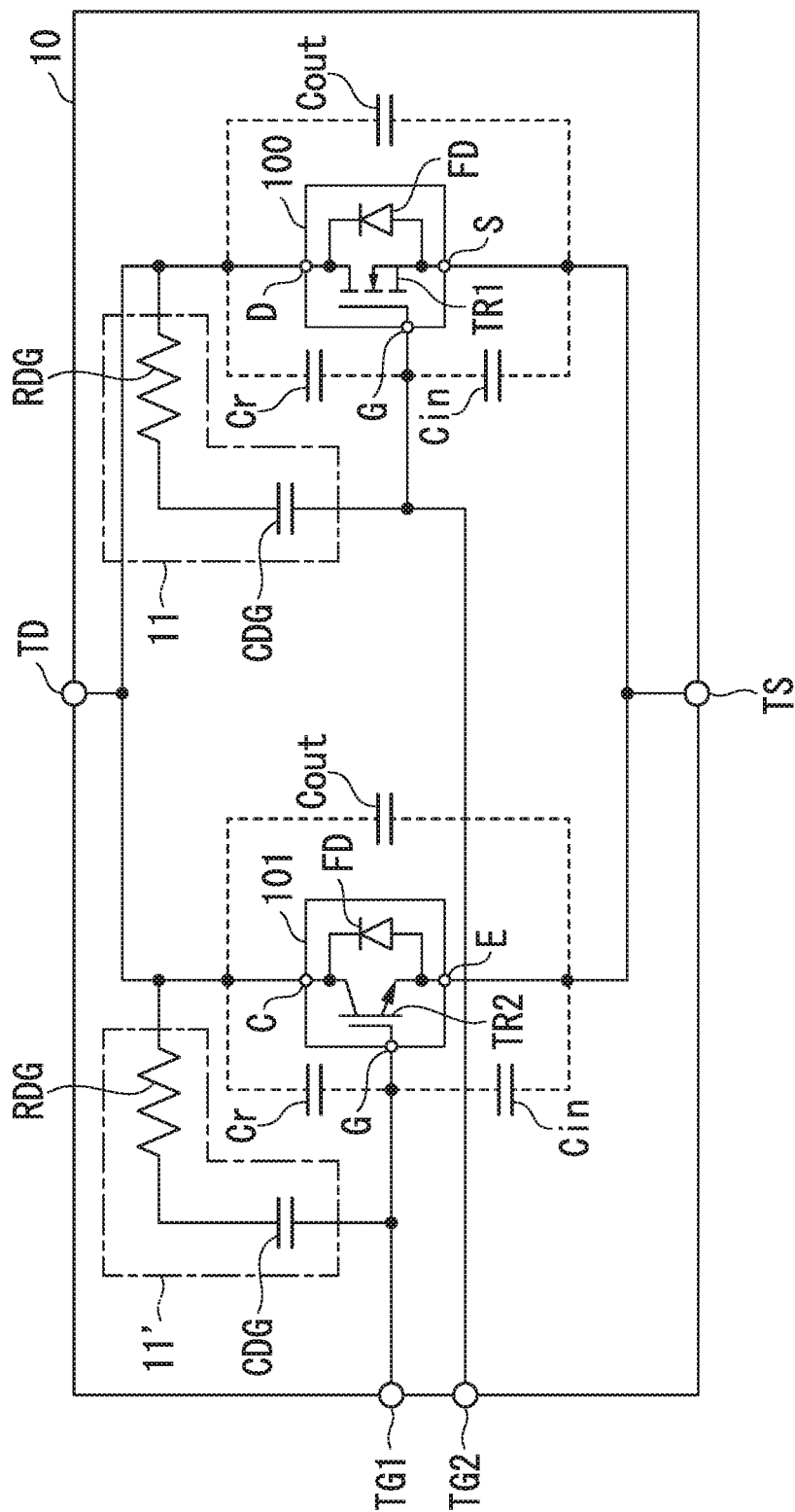
FIG. 13 is a view illustrating a circuit constitution of a semiconductor device according to a sixth embodiment.

As illustrated in FIG. 13, in a semiconductor device 10 according to the sixth embodiment, the bipolar switching element 101 and the unipolar switching element 100 are connected in parallel.

The transistor TR2 (IGBT) and the flyback diode FD are formed in the bipolar switching element 101. Further, the transistor TR1 (MOS-FET) and the flyback diode FD are formed in the unipolar switching element 100.

The semiconductor device 10 according to the sixth embodiment includes two external connection control terminals TG1 and TG2, an external connection high voltage side terminal TD, and an external connection low voltage side terminal TS.

The external connection control terminal TG1 is an external connection terminal for connecting the gate terminal G of the bipolar switching element 101 to an external circuit (the inverter circuit of the power conversion device 1) outside the package. The external connection control terminal TG2 is a terminal for connecting the gate terminal G of the unipolar switching element 100 to an external circuit outside the package.

Further, the external connection high voltage side terminal TD is a terminal for connecting the collector terminal C of the bipolar switching element 101 and the drain terminal D of the unipolar switching element 100 to an external circuit outside the package. The external connection low voltage side terminal TS is a terminal for connecting the emitter terminal E of the bipolar switching element 101 and the source terminal S of the unipolar switching element 100 to an external circuit outside the package.

As illustrated in FIG. 13, in the semiconductor device 10 according to the sixth embodiment, serial connection bodies 11 and 11' are respectively connected between the collector terminal C and the gate terminal G of the bipolar switching element 101 and between the drain terminal D and the gate terminal G of the unipolar switching element 100.

Here, in the serial connection body 11, the capacitance of the capacitor CDG and the resistance value of the resistor RDG are adjusted so that the resonance characteristics caused by the capacitance of the output capacitance Cout of the unipolar switching element 100 are reduced. Also, in the serial connection body 11', the capacitance of the capacitor CDG and the resistance value of the resistor RDG are adjusted so that the resonance characteristics caused by the capacitance of the output capacitance Cout of the bipolar switching element 101 are reduced.

In this way, the waveform oscillation at the time of switching operation can be appropriately suppressed regardless of whether the switching operation is performed in the unipolar switching element 100 or the bipolar switching element 101.

Although the semiconductor devices 10 according to the third to sixth embodiments have been described, each of the semiconductor devices 10 according to the third to sixth embodiments is applicable to the power conversion device 1 like in the first embodiment (see FIG. 1) and the second embodiment (see FIG. 8).

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A power conversion device including a semiconductor device, wherein the semiconductor device comprises:
a switching element comprising a high voltage side terminal, a control terminal, and a low voltage side terminal;
a serial connection body comprising a capacitor and a resistor connected between the high voltage side terminal and the control terminal,
wherein the capacitor and the resistor in the serial connection body are set as a time constant that suppresses resonance characteristics that occur due to an inductance component and a capacitance component present in a circuit to which the semiconductor device is connected and an output capacitance parasitic between the high voltage side terminal and the low voltage side terminal of the switching element.

2. The power conversion device according to claim 1, wherein a capacitance of the capacitor in the serial connection body is equal to or greater than a feedback capacitance that is parasitic between the high voltage side terminal, and
wherein the control terminal of the switching element and is set to be ten times or less the feedback capacitance.

3. The power conversion device according to claim 1, wherein the semiconductor device further comprises:
a package including the switching element therein; and
a substrate configured to support the switching element in the package,
wherein the capacitor and the resistor in the serial connection body are arranged on the substrate.

4. The power conversion device according to claim 1, wherein the semiconductor device further comprises:
an external connection control terminal that allows the control terminal of the switching element to be drawn outside of the package and to be connected to an external circuit,
wherein, in the package, a resistor is connected between the control terminal of the switching element and the external connection control terminal.

5. The power conversion device according to claim 1, wherein the semiconductor device further comprises:
a bipolar switching element configured to perform a bipolar operation as the switching element; and
a unipolar switching element configured to perform a unipolar operation as the switching element,
wherein the serial connection body is connected between the high voltage side terminal and the control terminal of the bipolar switching element and between the high voltage side terminal and the control terminal of the unipolar switching element.

6. The power conversion device according to claim 1, wherein the semiconductor device further comprises:
a switching element comprising a high voltage side terminal, a control terminal, and a low voltage side terminal;
a package including the switching element therein; and
two or more of each of an external connection high voltage side terminal that allows the high voltage side terminal to be drawn to the outside of the package and to be connected to an external circuit and an external connection control terminal that allows the control terminal to be drawn to the outside of the package and to be connected to an external circuit.

7. The power conversion device according to claim 6, wherein a serial connection body comprising a capacitor and a resistor is connected between the external connection high voltage side terminal and the external connection control terminal.

* * * * *